United States Patent
Chen et al.

(10) Patent No.: US 8,884,164 B2
(45) Date of Patent: Nov. 11, 2014

(54) CIRCUIT BOARD ASSEMBLY WITH FLEXIBLE PRINTED CIRCUIT BOARD AND REINFORCING PLATE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Shin-Wen Chen, New Taipei (TW); Wen-Hsiung Chen, New Taipei (TW); Yu-Tsan Cheng, New Taipei (TW); Wen-Chang Chen, New Taipei (TW); Shu-Sheng Peng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 152 days.

(21) Appl. No.: 13/707,572

(22) Filed: Dec. 6, 2012

(65) Prior Publication Data
US 2014/0027158 A1    Jan. 30, 2014

(30) Foreign Application Priority Data
Jul. 30, 2012    (CN) .......................... 2012 1 0266363

(51) Int. Cl.
| H05K 1/00 | (2006.01) |
| H05K 1/09 | (2006.01) |
| H05K 1/02 | (2006.01) |
| H05K 1/18 | (2006.01) |

(52) U.S. Cl.
CPC .. H05K 1/09 (2013.01); H05K 1/02 (2013.01); H05K 1/18 (2013.01)
USPC .......................................... 174/254; 174/255

(58) Field of Classification Search
CPC ............. H05K 1/02; H05K 1/18; H05K 1/09; H05K 1/0277; H05K 1/0215; H05K 2201/2009; H05K 2201/09054; H05K 1/0393; H05K 1/0218; H05K 2201/0715; H05K 1/189; H05K 1/118; H05K 1/141; H05K 3/4691; H05K 3/361; H05K 9/0039; H05K 1/0298; H05K 3/384; H04N 5/2257; H04N 5/335
USPC .......... 174/250–268; 361/748, 749, 760, 816, 361/818; 439/67, 77; 349/149, 150
See application file for complete search history.

(56) References Cited

U.S. PATENT DOCUMENTS

| 6,777,622 | B2 * | 8/2004 | Ueno et al. ..................... 174/262 |
| 7,132,607 | B2 * | 11/2006 | Yoshimi et al. ............... 174/255 |
| 8,058,559 | B2 * | 11/2011 | Muro et al. .................... 174/254 |
| 2014/0036116 | A1 * | 2/2014 | Peng et al. .................... 348/294 |

* cited by examiner

Primary Examiner — Ishwarbhai B Patel
(74) Attorney, Agent, or Firm — Novak Druce Connolly Bove + Quigg LLP

(57) ABSTRACT

A circuit board assembly includes a flexible circuit board, a dielectric layer and a reinforcing plate. The flexible circuit board includes a surface. A copper plating layer is positioned on the surface. The copper plating layer includes a circuit portion and a grounding portion. The circuit portion is entirely covered by the dielectric layer. The grounding portion is exposed outside the dielectric layer. The dielectric layer includes a bonding portion. The reinforcing plate includes a connection surface. The connection surface defines a cavity spatially corresponding to the bonding portion. The connection surface also includes an extending portion which is bulgy with respect to a bottom surface of the cavity. The extending portion spatially corresponds to the grounding portion. The bonding portion is received in the cavity with the extending portion in contact with and electrically connecting to the grounding portion by means of a conductive adhesive.

11 Claims, 4 Drawing Sheets

CIRCUIT BOARD ASSEMBLY WITH FLEXIBLE PRINTED CIRCUIT BOARD AND REINFORCING PLATE

BACKGROUND

1. Technical Field

The present disclosure relates to a circuit board assembly.

2. Description of Related Art

Circuit board assemblies are widespread. A typical circuit board includes a flexible printed circuit board and a reinforcing plate. The flexible printed circuit board is mounted on the reinforcing plate by means of a conductive adhesive. Thus it achieves functions of grounding and stiffening the circuit board assembly at the same time. While in the process of bonding of the flexible circuit board and the reinforcing plate, because the flexible circuit board is multi-layer structure, this does not allow the reinforcing plate to be smoothly attached to the flexible circuit board, and the reinforcing plate and the flexible circuit board are spaced from each other.

Therefore, it is desirable to provide a circuit board assembly which can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
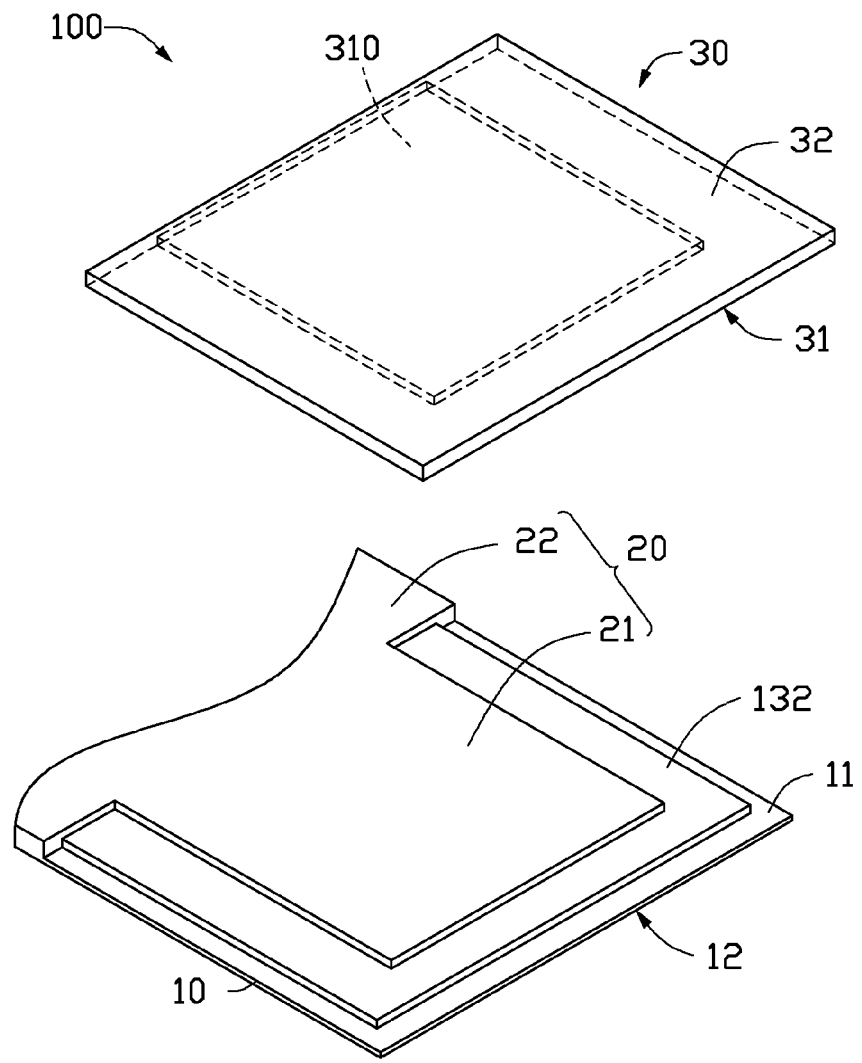
FIG. 1 is an exploded, isometric view of a circuit board assembly which includes a reinforcing plate, according to an exemplary embodiment.
Figure 2:
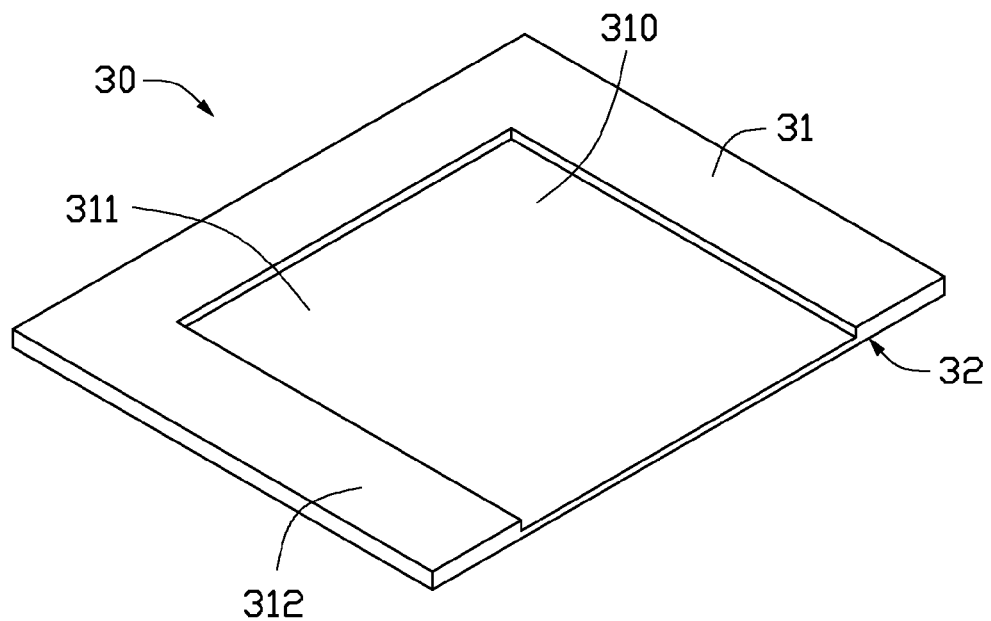
FIG. 2 is an isometric view of the reinforcing plate of FIG. 1, but viewed from another angle.
Figure 3:
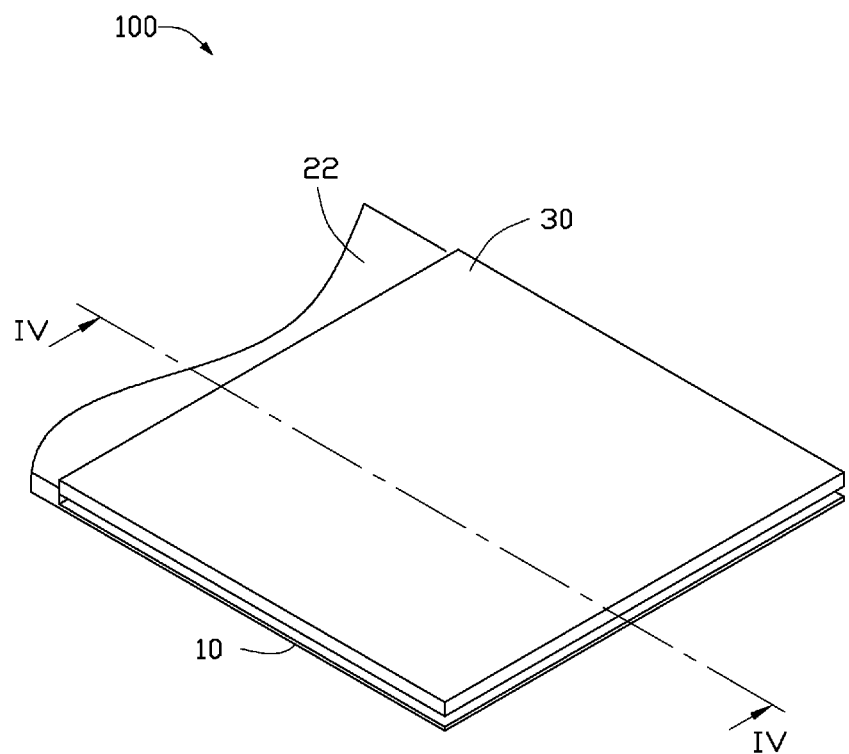
FIG. 3 is an assembled, isometric view of the circuit board assembly of FIG. 1.
Figure 4:
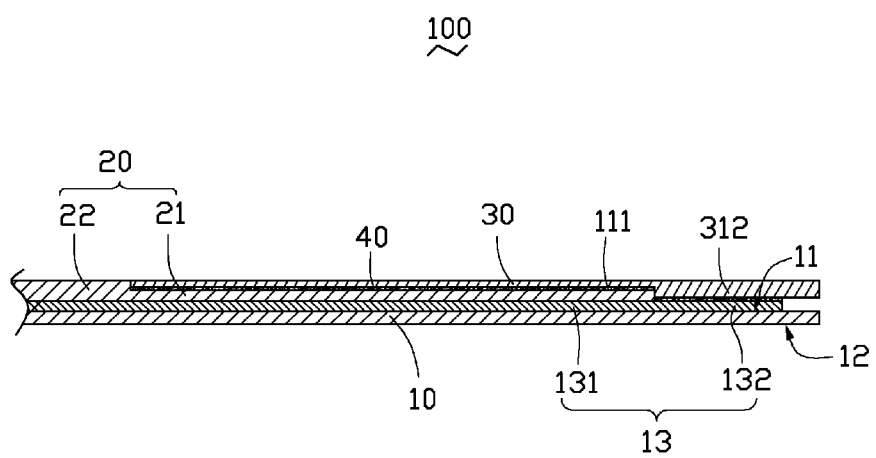
FIG. 4 is a cross-sectional view taken along line IV-IV of FIG. 3.

FIGS. 1-4 show a circuit board assembly 100, according to an exemplary embodiment. The circuit board assembly 100 includes a flexible circuit board 10, a dielectric layer 20, a reinforcing plate 30, and a conductive adhesive 40.

The flexible circuit board 10 includes a first surface 11 and a second surface 12 facing away from the first surface 11. A copper plating layer 13 is formed on the first surface 11.

The copper plating layer 13 is partially covered by the dielectric layer 20. The copper plating layer 13 includes a circuit portion 131 entirely covered by the dielectric layer 20 and a layer available for grounding purposes, i.e., grounding portion 132, exposed outside the dielectric layer 20.

The dielectric layer 20 is made of resin, and includes a bonding portion 21 and a non-bonded portion 22 connecting to the bonding portion 21. In the embodiment, the grounding portion 132 as laid out is "U" shaped, and surrounds the bonding portion 21 of the dielectric layer 20. In the embodiment, the bonding portion 21 is substantially rectangular in shape.

The reinforcing plate 30 is made of metal. The shape of the reinforcing plate 30 corresponds to the shape of the bonding portion 21. In the embodiment, the reinforcing plate 30 is also substantially rectangular in shape. The reinforcing plate 30 is mounted on the bonding portion 21 of the dielectric layer 20 by means of the conductive adhesive 40. The reinforcing plate 30 includes a connection surface 31 connected to the dielectric layer 20 and a supporting surface 32 facing away from the connection surface 31. The connection surface 31 defines a cavity 310 spatially corresponding to the bonding portion 21 of the dielectric layer 20. In the embodiment, the shape and size of the cavity 310 of the reinforcing plate 30 respectively correspond to the shape and size of the bonding portion 21 of the dielectric layer 20. The connection surface 31 also includes an extending portion 312 which is bulgy with respect to a bottom surface 311 of the cavity 310. The extending portion 312 spatially corresponds to the grounding portion 132 of the copper plating layer 13. The shape of the extending portion 312 corresponds to the shape of the grounding portion 132. In the embodiment, the extending portion 312 providing electrical connections is also "U" shaped.

In the embodiment, the conductive adhesive 40 is an Anisotropic Conductive Film (ACF), which coats the bottom surface 311 of the cavity 310 and entirely covers all of the extending portion 312.

In assembly, when the bonding portion 21 of the dielectric layer 20 is received in the cavity 310 of the reinforcing plate 30, the extending portion 312 makes contact with and electrically connects to the grounding portion 132 by means of the conductive adhesive 40.

It should be noted that the size of the bonding portion 21 can be smaller than the bottom surface 311 of the size of the cavity 310, in other alternative embodiments.

It should also be noted that the conductive adhesive 40 can only cover the extending portion 312, in other alternative embodiments.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A circuit board assembly comprising:
    a flexible circuit board comprising a first surface;
    a copper plating layer positioned on the first surface, the copper plating layer comprising a circuit portion and a grounding portion;
    a dielectric layer, the circuit portion entirely covered by the dielectric layer, the grounding portion exposed outside the dielectric layer, the dielectric layer comprising a bonding portion, the grounding portion surrounding the bonding portion;
    a conductive adhesive; and
    a reinforcing plate comprising a connection surface connected to the bonding portion, the connection surface defining a cavity spatially corresponding to the bonding portion, the connection surface also comprising an extending portion which is bulgy with respect to a bottom surface of the cavity, the extending portion spatially corresponding to the grounding portion, the bonding portion received in the cavity with the extending portion in contact with and electrically connecting to the grounding portion by means of the conductive adhesive.

2. The circuit board assembly of claim 1, wherein the shape of the extending portion corresponds to the shape of the grounding portion.

3. The circuit board assembly of claim 2, wherein the grounding portion is "U" shaped.

4. The circuit board assembly of claim 1, wherein the reinforcing plate is made of metal.

5. The circuit board assembly of claim 1, wherein the dielectric layer is made of resin, and comprises a non-bonded portion connecting to the bonding portion.

6. The circuit board assembly of claim 1, wherein the conductive adhesive coats a bottom surface of the cavity.

7. The circuit board assembly of claim 1, wherein the shape and size of the cavity of the reinforcing plate respectively correspond to the shape and size of the bonding portion.

8. The circuit board assembly of claim 1, wherein the size of the bonding portion is smaller than the size of bottom surface of the cavity.

9. The circuit board assembly of claim 1, wherein the conductive adhesive is an anisotropic conductive film.

10. The circuit board assembly of claim 1, wherein the shape of the reinforcing plate corresponds to the shape of the bonding portion.

11. The circuit board assembly of claim 10, wherein both the bonding portion and the reinforcing plate are substantially rectangular in shape.

* * * * *